United States Patent
Korman

[11] Patent Number: 5,959,357
[45] Date of Patent: Sep. 28, 1999

[54] FET ARRAY FOR OPERATION AT DIFFERENT POWER LEVELS

[75] Inventor: Charles Steven Korman, Schenectady, N.Y.

[73] Assignee: General Electric Company, Schenectady, N.Y.

[21] Appl. No.: 09/024,485

[22] Filed: Feb. 17, 1998

[51] Int. Cl.$^6$ .......................... H01L 23/552; H01L 23/48; H01L 23/52

[52] U.S. Cl. ............................ 257/758; 257/659; 257/660

[58] Field of Search .................................. 257/750–758, 257/658–660, 668–670; 438/151–152, 384, 586

[56] References Cited

U.S. PATENT DOCUMENTS

| | | |
|---|---|---|
| 4,783,695 | 11/1988 | Eichelberger et al. . |
| 5,384,691 | 1/1995 | Neugebauer et al. . |
| 5,455,442 | 10/1995 | Neilson et al. ........................ 257/341 |
| 5,696,403 | 12/1997 | Rostoker et al. ...................... 257/659 |

FOREIGN PATENT DOCUMENTS 402098160  4/1990  Japan ...................................... 257/758

Primary Examiner—Tom Thomas
Assistant Examiner—Chuong Puang Nguyen
Attorney, Agent, or Firm—Jill M. Breedlove; Douglas E. Stoenr

[57] ABSTRACT

A FET package including one or more FETs includes an arrangement of three metallization layers for the gate, drain, and source terminals thereof. The layers include a gate runner metallizaton layer that allows the FETs to be arranged in a parallel manner so as to reduce the overall total on-state resistance to an optimum value, while allowing the gate switching capacitance to be increased to an optimized value. The gate runner metallization layer is arranged to minimize the overlapping capacitance between the gate and source terminals and between the gate and drain terminals. Additional semiconductor devices may be incorporated into the FET package using additional terminals interconnected through the metallization layers, thus providing additional functions.

12 Claims, 7 Drawing Sheets

GATE TURN-OFF CONFIGURATION

PARALLEL FETS

CURRENT MIRROR

GATE DRIVER CONFIGURATION

FET ARRAY FOR OPERATION AT DIFFERENT POWER LEVELS

FIELD OF THE INVENTION

The field of the invention relates generally to field-effect transistors.

BACKGROUND OF THE INVENTION

Field-effect transistors (FETs), in particular metal-oxide-semiconductor field-effect transistors (MOSFETs), have become increasingly popular for use in various power switching applications due to their inherent capability of switching at high frequencies (turn-on and off within 10 ns). Because of this high switching capability, power circuits that employ FET devices have been increasingly directed toward operation at high frequency. The main motivation for high frequency (f) operation is the reduction in size (proportional to 1/f) of passive components, such as transformers and filter capacitors, which can comprise a substantial proportion of volume of devices. Being able to switch a power semiconductor (FET) at a higher frequency allows one to take advantage of 1/f scaling of magnetics (due to lower flux density) and filters (since energy storage $\alpha$ $CV^2f$). For operation up to 1 MHz, the FET's performance is satisfactory; however, as the frequency is increased to 10 MHz and beyond, several factors limit its switching efficiency and safe operating area (SOA). The most critical limitation relates to the gate arrangement of FET arrays integrated onto a silicon wafer or die in electrical parallel fashion. For the majority of power FETs, the gate electrode is comprised of a polycrystalline silicon material that has an order of magnitude of higher resistivity than other metals, such as aluminum. The use of polycrystalline silicon is primarily selected because of its superior properties, including its ability to withstand high temperature and its ability to achieve a well-controlled electrical interface with silicon oxide.

Although the polycrystalline silicon has advantageous characteristics, the use of polycrystalline silcon for a gate electrode does suffer certain drawbacks which may be described with reference to FIG. 1 illustrating a prior art network 100. In FIG. 1, a plurality of polycrystalline gate electrodes are illustrated by a plurality of polysilicon resistor-MOS gate networks $102_1$, $102_2$, $102_3$ . . . $102_N$. As seen in FIG. 1, typically a gate signal 104 is distributed outward from a pad 106 centrally located within a die and by using an alluminum run, commonly referred to as a gate runner which has limitations for effectively reducing gate resistance. As used herein, the pad is a conductive area of an integrated circuit specially designed and positioned for interconnection to other circuit chips, with the pad being typically positioned around the periphery of the chip. The gate signal 104 propagates from the gate pad connection 106 and into the polysilicon resistor-MOS gate networks $102_1$, $102_2$, $102_3$ . . . $102_N$ which act as delay lines. The delay encountered may be envisioned by the examination of the expression 108 of FIG. 1.

Consequently, during turn-on, the FET transistor represented by the polysilicon resistor-MOS gate networks $102_1$ . . . $102_N$ closest to the gate pad 106 will turn on first, and the FET farthest away from the gate pad 106 with turn on last. This non-uniform turn-on has several disadvantages which increase as the operational frequency, f, increases, one of which is that the effective average-on resistance will be less than the static on-resistance. Another disadvantage, which is of more concern, is over stressing FETs closest to the gate pad 106 because they carry a larger share of the load current than those located further away from the gate pad 106. In addition, a similar situation occurs during turn-off when those FETs farthest away from the gate pad 106 are the last to turn-off, again resulting in an uneven distribution of current. For the arrangement of FIG. 1, under surge conditions, failures of the FETs occur, and such failures are usually seen as occurring near the gate pads.

To promote faster switching speeds, interconnection from one FET of the array to another FET of the array needs to be accomplished with a minimum of capacitive loading and a minimum of interconnect length, thus keeping the inductance of the interconnections low. Capacitive and inductance loading tend to slow down signal transmission such that high speeds cannot be maintained by FETs in communicating from each other. Although this is not a problem for the FETs in close proximity, it is for the others. The arrangement of FIG. 1 suffers from these limitations.

In addition, the gate resistance encountered when using a polycrystalline silicon gate electrode affects switching losses when a FET used for high power switching application is excited by a sinusoidal waveform. For such excitation, the gate switching loss is proportional to the gate resistance of the power FET, as well as to other resistances in the gate drive circuits. In conventional gate drive circuits, the other resistances include series interconnect resistances between driver devices and the main power FETs being driven by the driver. In order to switch at high frequencies, it is known to use sinusoidal (resonant) drive techniques so that the switching loss is proportional to the gate resistance instead of frequency. However, these techniques require the use of devices external to the FET chip which, in turn, adds to the inductance of the interconnection leads which, in turn, degrades the switching speed capability of the FET.

The efficiency of an FET is effected by conduction and switching contributors. In general, conduction losses are inversely related to the size (or resistance) of a power FET die, while gate switching losses are directly related to the size (or gate capacitance). Thus, balancing the losses between conduction and switching becomes a difficult task. In particular, as the switching frequency is increased, the use of larger devices to reduce conduction losses becomes counterproductive due to corresponding increases in switching losses that are proportional to the switching frequency. For any power circuit operating at a given switching frequency, there is an optimum FET size (resistance and capacitance) that minimizes power losses. However, this optimum FET size is not always easily achieved in practice because economics prevent a vendor from offering more than a few off-the-shelf FET dies, each having a given breakdown voltage and power level which determine the FET die size.

It is thus desirable that a FET and arrays thereof be provided that may be easily optimized for any given power level. It is further desirable to so optimize FETs and arrays thereof using the limited inventory of conventionally available FET dies.

Manufacturers have recently addressed the problem of uneven gate signal distributions, described with reference to FIG. 1, in various ways, e.g., by incorporating an extra level of metallization of gate runners, thereby reducing gate runner resistance. For relatively high voltage devices, a multiplicity of aluminum gate runners may typically be realized, but for relatively low voltage devices having limited topology, this multiplicity is not realizable. Although a reduction in gate runner resistance for relatively high voltage devices has advantageous effects, the extra level of metallization adds a burden to the device fabrication process.

In addition, additional circuits, such as current mirrors, have been incorporated into device packages to protect devices from lower switching speeds, but this added circuitry represents a costly increase.

High density interconnect (hDI) structures for integrated circuit packaging, as more fully described, for example, in U.S. Pat. Nos. 4,783,695 and 5,384,691, both of which are herein incorporated by reference, overcome some disadvantages of device element interconnections. HDI packaging utilizes metallization layers that provide excellent electrical conductivity for the interconnection of individual chips and, thus, substantially reduce the unwanted self-inductance and capacitive loading drawbacks caused by using leads to provide interchip and intrachip connections. Et is desirable to utilize the HDI techniques to free the off-the-shelf FET devices of their switching speed and performance limitations.

It is thus desirable to provide a FET array employing high density interconnect (HDU) techniques to reduce the effective resistance of polycrystalline silicon gate electrodes and to reduce the capacitive and inductance loading effects of interconnections, which limit the switching capabilities of the FET array, while at the same time providing a FET array free of the limitation of the degraded circuit performance due to the limited availability of various types of off-the-shelf FETs.

SUMMARY OF THE INVENTION

The present invention is directed to an arrangement of three or more metallization layers for the source, drain and gate terminals of one or more off-the-shelf field-effect transistors (FETs) to form a package that compensates for the high resistance of its polycrystalline silicon gate electrodes and provides a high-level of circuit performance having an optimum balance between conduction (resistance) and switching (capacitance) losses.

The (FET) package comprises one or more FETs, each having gate, source and drain terminals, the gate terminals having a predetermined resistance, the FET package also having a predetermined "overlap" capacitance between the gate and source terminals. The FET package comprises first, second and third layers of metallization. The first layer of metallization comprises a substrate on which each of the one or more FETs is affixed. The first layer is electrically interconnected to the drain terminal of each of the one or more FETs. The second layer of metallization is arranged in parallel with the first layer and configured to reduce the overlap capacitance between the gate and source terminals. The second layer is electrically interconnected to the source terminal of each of the FETs by means of a plurality of via openings. The third layer of metallization comprises a gate runner and is electrically interconnected to the gate terminal of each of the FETs and configured to reduce the gate resistance of the one or more FETs.

Additional semiconductor devices may be incorporated into the FET package using additional terminals interconnected through the metallization layers, thus providing additional features such as, for example, gate driver devices, over-temperature monitors, and current mirror devices.

BRIEF DESCRIPTION OF THE DRAWINGS

The features of the invention believed to be novel are set forth with particularity in the appended claims. The invention itself, however, both as to organization and method of operation thereof, together with further objects and advantages thereof, may be best understood with reference to the following description taken in conjunction with the accompanying drawings in which like characters represent like parts throughout the drawings, and in which:

DETAILED DESCRIPTION OF THE PREFERRED EMBODIMENTS

Figure 2:
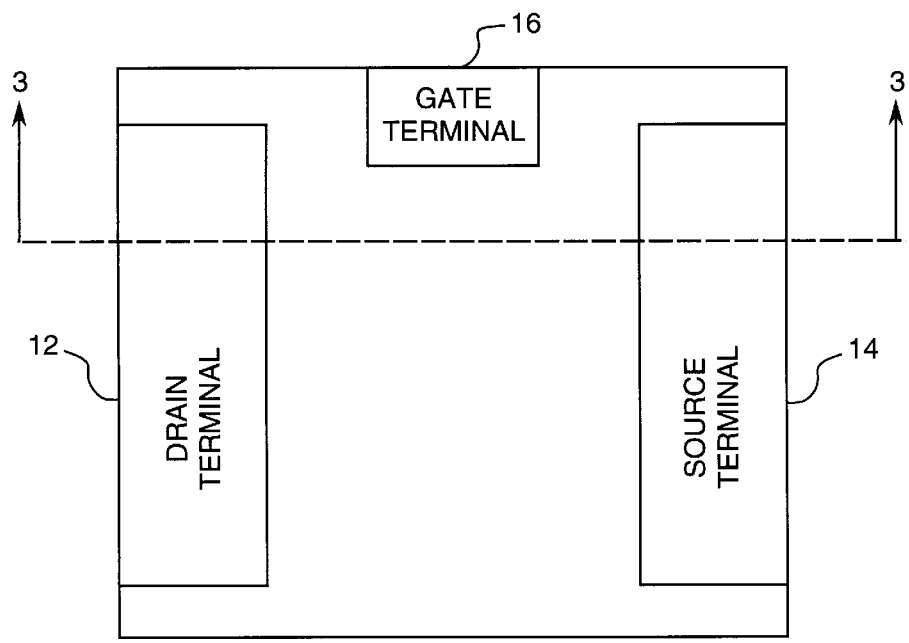
FIG. 2 illustrates a field-effect transistor according to one embodiment of the present invention.

FIG. 2 illustrates a field-effect transistor (FET) 10 array bilock according to a preferred embodiment of the present invention, preferably a retail-oxide-semiconductor field-effect transistor (MOSFET) and particularly suited for power applications, such as those described in U.S. Pat. No. 5,384,691, issued Jan. 24, 1995. FET block 10 comprises one or more FETs which may be of conventionally, off-the-shelf-type. FET bilock 10 is fabricated using high density interconnect (HDI) techniques, as described in U.S. Pat. No. 4,783,695 issued Nov. 8, 1988. The FET 10 has drain, source and gate terminals 12, 14 and 16, respectively, which may also be referred to herein as drain, source and gate electrodes, respectively or, alternatively, as drain, source and gate pads, respectively. A plurality of FETs 10 may be arranged, as to be described, into a multi-device package that has three terminals for external connections: a gate control, a power source, and a drain. These three terminals can be surface mount posts or wire bond pads or other suitable terminals.

Figure 1:
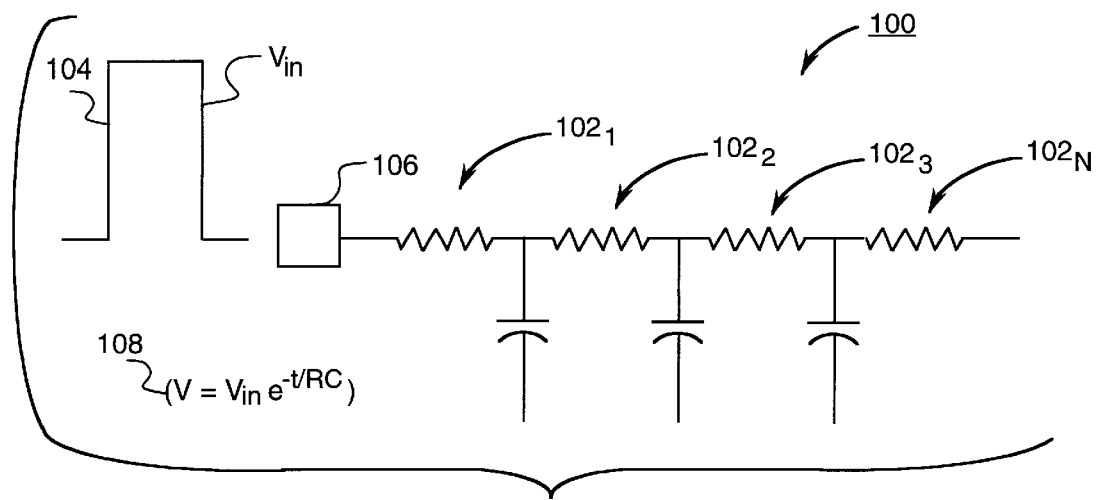
FIG. 1 is a circuit diagram illustrating a conventional field-effect transistor employing a polycrystalline gate electrode represented by polysilicon resistor-MOS gate networks.

In one embodiment, the FET array block of FIG. 1 is a standalone multichip module having top-side connections for the drain, gate, and source. With the contacts all on one side, rather than both top and bottom, one-side packaging techniques may be advantageously used.

Figure 3:
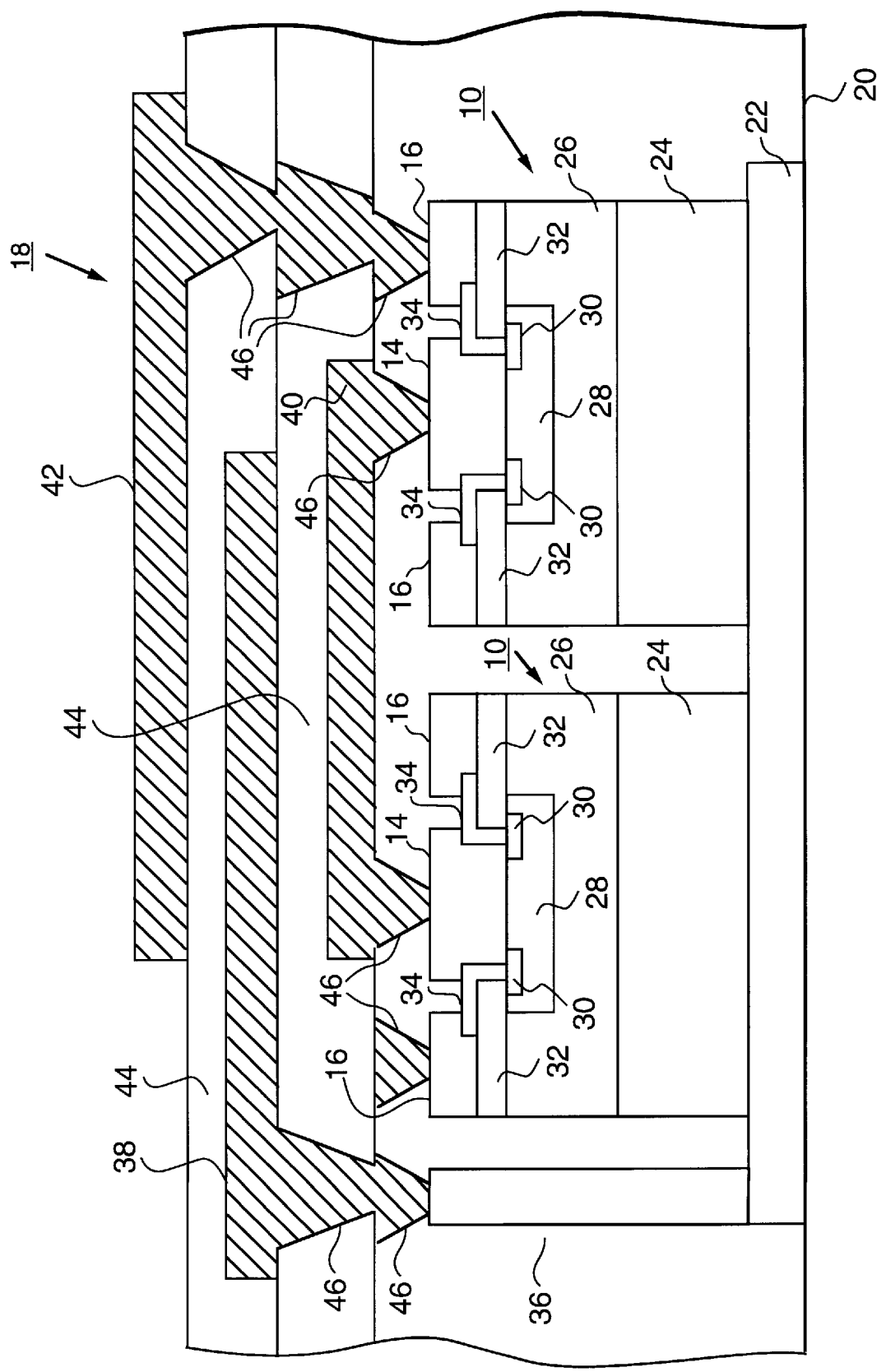
FIG. 3 is a view taken along line 3—3 of FIG. 2 illustrating the cross-section of the FET of FIG. 1.

FIG. 3 illustrates a multi-device, high density interconnect (HDI) package 18 comprising two or more FETs 10 which, for the purpose of illustration, are power FETs. FIG. 3 illustrates a ceramic substrate 20 on which is affixed a copper pad 22 which serves as a heat spreader. Each of the FETs 10 is conventional in nature and comprises a N+ substrate drain layer 24 having a metallized surface serving as the drain terminal 12 (FIG. 2) which is soldered to the copper pad 22. Overlaying each drain layer 24 is a N– epitaxy layer 26 which has its middle region occupied by a P– base layer 28 which, in turn, contains a N+ layer 30. A polycrystalline silicon gate layer 32 overlays, as shown in FIG. 3, portions of layers 28 and 30, and a N+ diffused layer 34 overlays, as shown in FIG. 3, portions of layers 30 and 32. The gate metal layer 16, previously referred to as gate terminal 16, overlaps, as shown in FIG. 3, portions of layers 32 and 34; and a source metal layer 14, previously referred to as source terminal 14, overlays, as shown in FIG. 3, portions of layers 28, 30, and 34.

Figure 4:
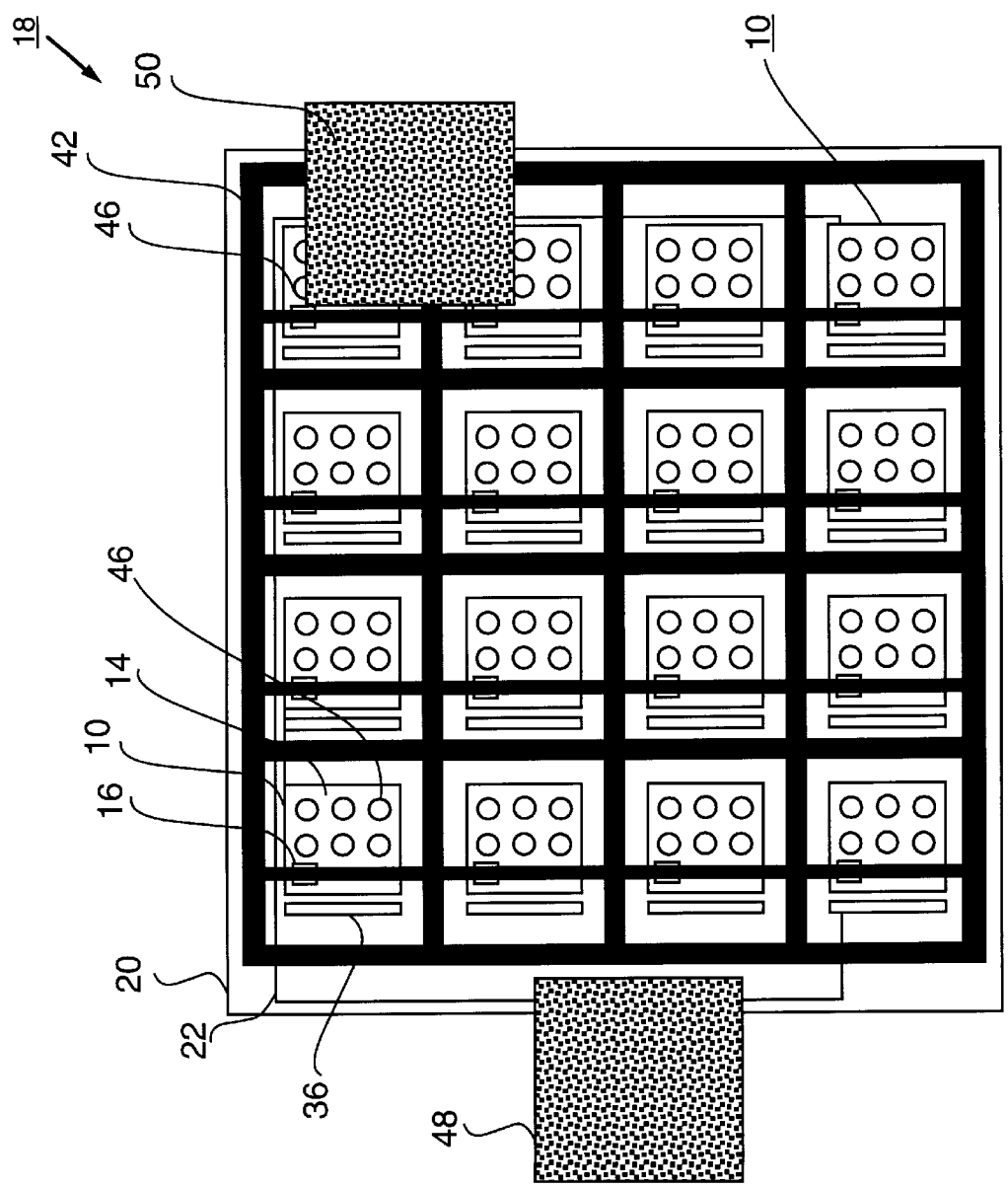
FIG. 4 illustrates a preferred embodiment of a FET array of the present invention.

The drain terminal 12, in one embodiment, may be located on the bottom of the FET 10; that is, the metallized surface of the drain layer 24 is soldered to the copper pad 22 which, in turn, interconnects all of the drain terminals of the FETs together. For such bottom drain terminals, an electrical feed-through member, to be discussed with reference to element 48 of FIG. 4, is provided to electrically connect the drain terminals to external devices. In another embodiment, the drain terminal 12 may be located on the top of the FET 10 (as shown in FIG. 2) by means of a copper post separated from the FET 10 indicated by reference number 36 in FIG. 3, which is soldered to the copper pad 22 and extends upward to the top surface of at least one of the FETs 10.

FIG. 3 further illustrates first, second and third metallization layers 38, 40 and 42 for interconnecting the drain, source and gate terminals, 12, 14 and 16, respectively. The first and second layers 38 and 40, respectively, are preferably comprised of copper and have a typical thickness of 0.5 mils, whereas the third layer 42 is preferably comprised of copper and has a typical thickness in the range from about 0.5 to 1.0 mils. The first and second metallization layers 38 and 40 are arranged into two planes parallel to each other so as to reduce the overall parasitic inductance of the multi-device package 18. It should be noted that for bottom-side drain terminals, there is no need for the copper post 36; and the copper pad 22, which has a typical thickness of 5 mils, serves the same purpose as first metallization layer 38.

As further seen in FIG. 3, the layers 38, 40 and 42 are separated from each other by a polyimide dielectric layer 44 having a typical thickness of 1 mil and comprised of a resin based polymer composite which may be Kapton® which is available from E.l. DuPont de Nlemours & Co.

Each of the layers 38, 40 and 42 is connected to the drain, source and gate terminals 12, 14, and 16, respectively, by way of one or more vias 46 formed in the associated dielectric layer 44. Alternatively, the respective dielectric layers 44 may be ablated to expose the drain (copper post 36), source and gate terminals 12, 14, and 16, respectively, and provide appropriate connections thereto. For the embodiment of FIG. 3, layer 38 has a two-step via 46 arrangement: layer 40 has a single via 46 arrangement, and layer 42 has a three-step via 46 arrangement which, for the sake of clarity, is only shown for the right-most FET 10 of FIG. 3. The arrangement of vias 46 may be selected so that layers 38, 40 and 42 may have any elevation with respect to each other. The multi-device, high density interconnect package 18 is further described with reference to FIG. 4.

FIG. 4 illustrates an arrangement of sixteen (16) power FETs 10. FIG. 4, for the sake of clarity, only completely illustrates the third metallization layer 42 associated with gate terminal 116 and not the first and second metallization layers 38 and 40 (shown in FIG. 3), respectively, of the drain 12 and source 14 terminals, respectively. However, FIG. 4 illustrates contact pads 48 and 50 both comprised of an electrically conductive material and associated with drain and source terminals 12 and 14, respectively.

The contact pad 48 was previously referred to with reference to FIG. 3 as a feed-through member 48 and is electrically connected by appropriate means, such as soldering or direct copper bonding, to copper pad 22 which, as previously described with reference to FIG. 3, has electrically connected thereto each of the drain terminals of each of the FETs 1 0 comprising the multi-device package 18. The contact pad 48 provides a one-place electrical connection of the drain terminals 12 to external devices. For such an arrangement for contact pad 48, there is no need for the copper posts 36, shown in FIG. 4.

The contact pad 50 is electrically connected to the source terminals of each of the FETs 10 by way of the second metallization layer 40 (shown in FIG. 3) and the vias 46 shown in FIG. 4, but more completely illustrated in FIG. 3. The contact pad 50 provides a one-place electrical connection of the source terminals 14 to external devices.

The third metallization layer 42 advantageously provides a single continuous layer arranging all of the gate terminals 1 6 of all of the FETs 10 in parallel with each other. On addition, the third metallization layer 42 is arranged relative to the first (drain) and second (source) metallization layers, 38 and 40, respectively, so as to minimize overlap therebetween which, in turn, minimizes the overlap capacitance between both the gate (layer 42) and drain (layer 38) terminals, 16 and 12, respectively, and the overlap capacitance between the gate (layer 42) and source (layer 40) terminals, 16 and 14, respectively, which, in turn, minimizes the reduced switching speeds of the FETs 00.

Figure 5:
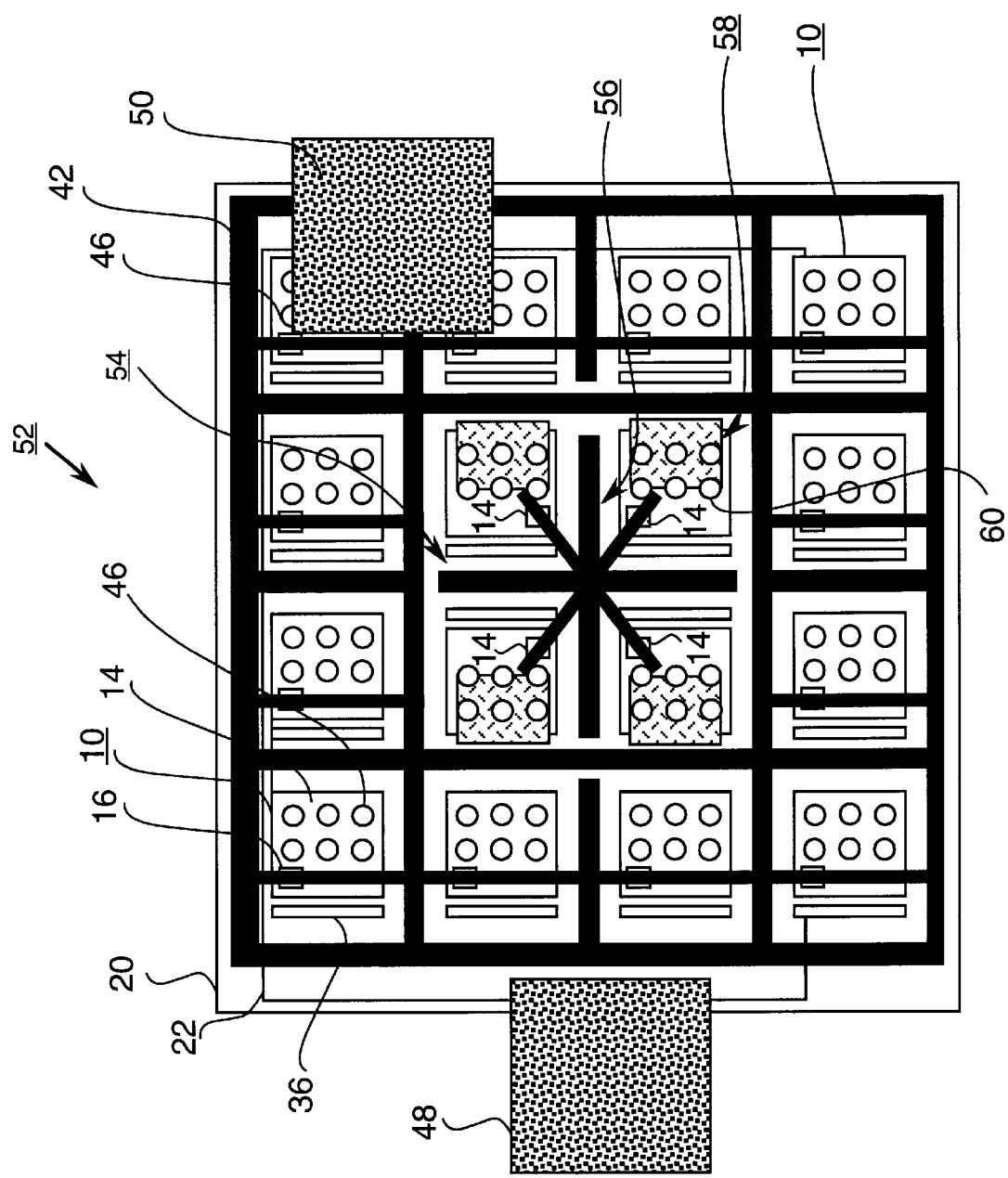
FIG. 5 illustrates another preferred embodiment of a FET array of the present invention.

FIG. 5 illustrates an FET array 52 which is similar to the FET array 18 of FIG. 4 with the addition of a gate driver network 54 integrated into, i.e., made a part of the array 52 and located at the central region thereof. The gate driver network 54 is centrally located so as to take advantage of the symmetrical layout provided by a signal distribution arrangement 56 having an X-shaped central portion with the ends thereof electrically connected to the gate terminals 14 of the four FETs comprising the gate driver network 54. FIG. 5 further illustrates a metallization region 58 which interconnects the source terminals of the FETs 1 0 by way of vias 60 of the gate drive network 54 and, if desired, may be part of the second metallization layer 40, shown in FIG. 3, which, in turn, is connected to the contact pad 50. If the gate driver network 48 is to remain separate from the metallization layer 40, then a contact pad (not shown) for the source terminals, as well as a contact pad for the drain terminals, of the FETs 10 of the gate driver network 48 needs to be provided in a manner as described for contact pads 50 and 48 of FIG. 3. The FETs 10 of FIGS. 4 and 5, as well as those of FIGS. 2 and 3, have a single gate contact so as to yield one effective gate resistance. The effective gate resistance may be further reduced by using a FET having four gate contact pads, as described with reference to FIG. 6.

Figure 6:
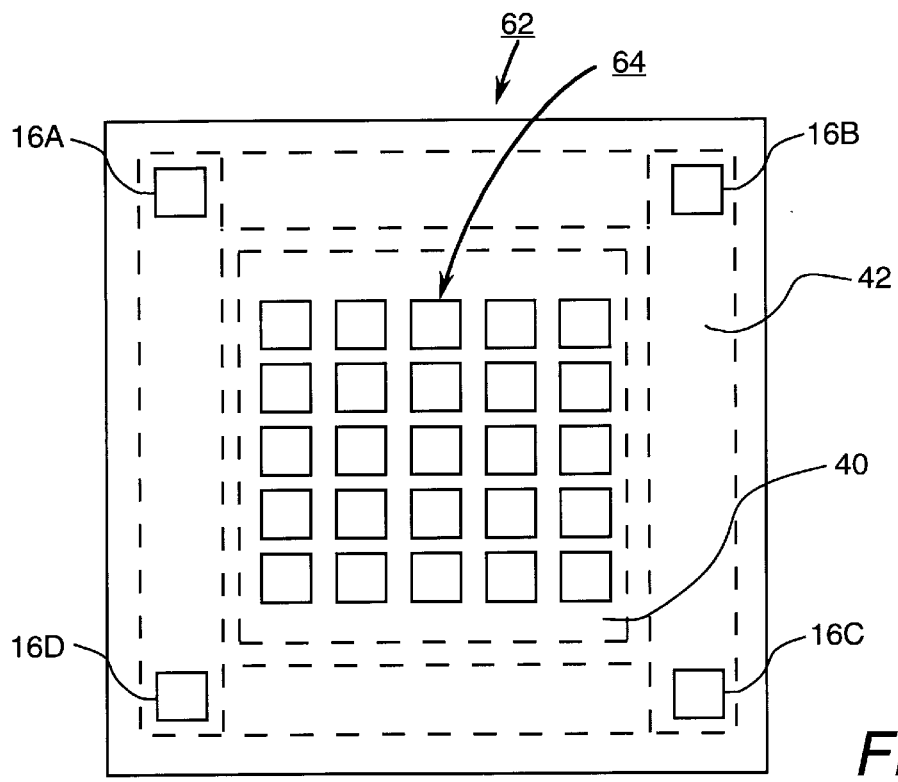
FIG. 6 illustrates another preferred embodiment of a FET device of the present invention.

FIG. 6 illustrates a FET 62 having four gate terminals 1 6A, 16B, 16C, 16D located in the four corners of the periphery of FET 62 and interconnected by the third metallization layer 42. The FET 62 further comprises a contact pad array 64 electrically connected to the second layer 40 which may be used to replace the source contact pad 50 of FIGS. 4 and 5. HIDI structures are advantageously employed to provide second and third level interconnect structures such as those illustrated in FIG. 6.

In operation, and with reference to FIG. 4, the FET array 18 has the same breakdown voltage and/or power level of the individual FETs 10 mounted thereon. Actually, the breakdown voltage is determined by the FET 10 having the lowest breakdown voltage. The terms "breakdown voltage" and "power level" may be used herein in an interchangeable manner to describe the power switching parameters of the FETs 10 described herein. The total on-state resistance of the FET array 18 is the parallel combination of the on-state resistance of the individual FETs 10. Therefore, if sixteen individual FETs are used, as shown in FIG. 4, the total resistance of the FET array 18 is sixteen times lower than one FET 10, as are conduction losses, of the individual FETs 10. And, the gate switching capacitance of the array 18 is also sixteen times higher than that of the individual FET 10. However, for a given application, the number of FETs 10 can be selected to provide an optimum balance between conduction (resistance) and switching (capacitance) losses. Further, the selectable number increases the yield of FETs 10 because it eliminates the need for fabricating one FET 10 having the desired conduction and switching losses. The selection of the number of FETs 10 that yields the desired conduction and switching losses associated with the gate resistance of the FETs 10 may be further described with reference to FIG. 7.

Figure 7:
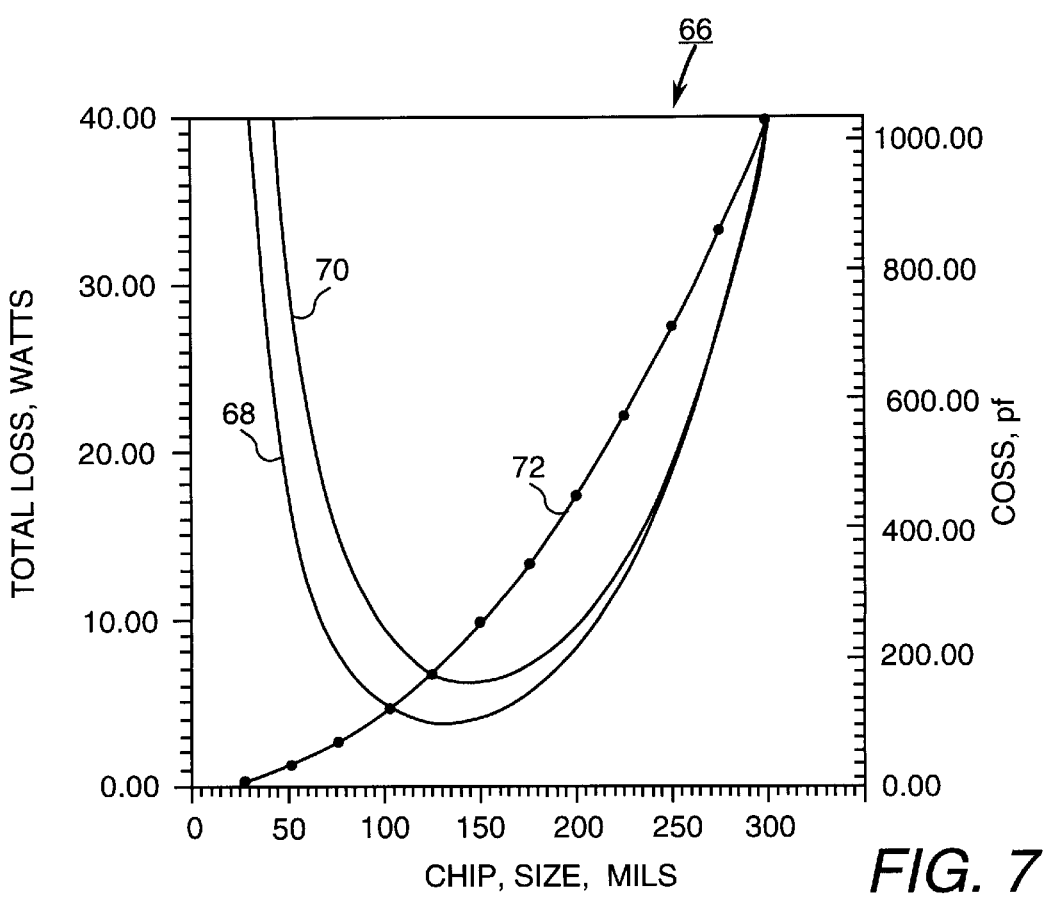
FIG. 7 illustrates performance curves related to the operation of the present invention.

FIG. 7 illustrates a family 66 of plots representative of the total FET power distribution as a function of FET area. The family 66 is comprised of plots 68, 70, and 72, wherein plots 68 and 70 represent the operational responses of off-the-shelf FET types 1 RF1 50 and 1RF230, respectively, and wherein plot 72 represents the capacitance of a particular FET having a switching capability that exceeds 1 MKHz. FIG. 7 has an X axis representative of chip size (mils) of the FET and two Y axes, with the first Y axis representative of resistance loss (watts) and with the second Y axis representative of capacitive loss (pf).

As seen in FIG. 7, minimum power loss is a strong function of the FET size, and this minimum power loss depends upon voltage rating, switching frequency, and power level. The parameters illustrated in FIG. 7 may be selected in a manner so that the FET 10 or the FET arrays 18 and 52 provide an optimum arrangement with regard to on-resistance and switching capacitance. More particularly, the FET 10 may be selected to have a chip size of 50 mils (gradient of X axis of FIG. 7) and then the number of FET's 10 may be selected to correspond to any desired operational region with respect to plots 68, 70 and 72.

One advantage of the selection of the number of FETs that determine the FET array is the ability to build large devices, not only large FET arrays, but also large MOS-gated arrays such as those comprised of IGIBTs that operate at relatively low switching frequencies (10 KHz–150 KHz) when compared to the FET 10 as described hereinabove having switching speeds of from 100 KHz to less than 10 MHz. Such selectable arrays provide an advantage because conduction losses tend to dominate for these switching frequencies. Further, the practice of the present invention is equally applicable to MOS-FET power devices whose utilization, for example, is more fully described in U.S. Pat. No. 5,384,691.

Other devices (i.e., other than FETs of gate driver network 54) may be incorporated into the arrays of the present invention to provide even better performance and/or more features. It should be noted that the added devices are integrated into the FET arrays of the present invention without additional leads, i.e., thereby avoiding disadvantageous capacitive and inductance loading effects, but rather are integrated by the metallization layers previously described having a minimum of capacitive loading and a minimum of interconnect length. For these other devices, exemplary building blocks may include over-temperature monitors, electrostatic discharge (ESD) damage protection, and current mirror devices. The other devices may be such as those generally illustrated in FIG. 8.

Figure 8A:
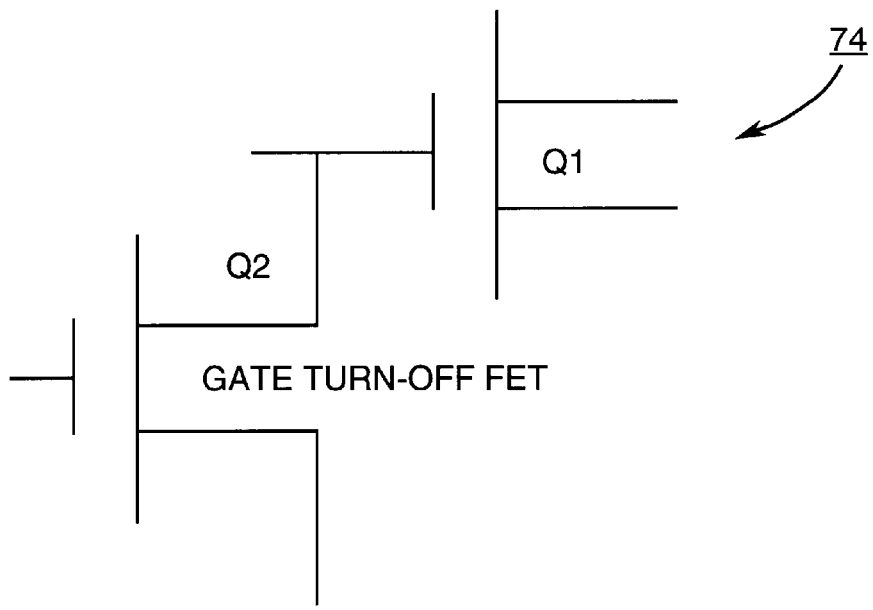
FIG. 8 is composed of FIGS. 8(a), 8(b), 8(c) and 8(d) showing schematics of devices that may be integrated into the FET arrays of the present invention.
Figure 8B:
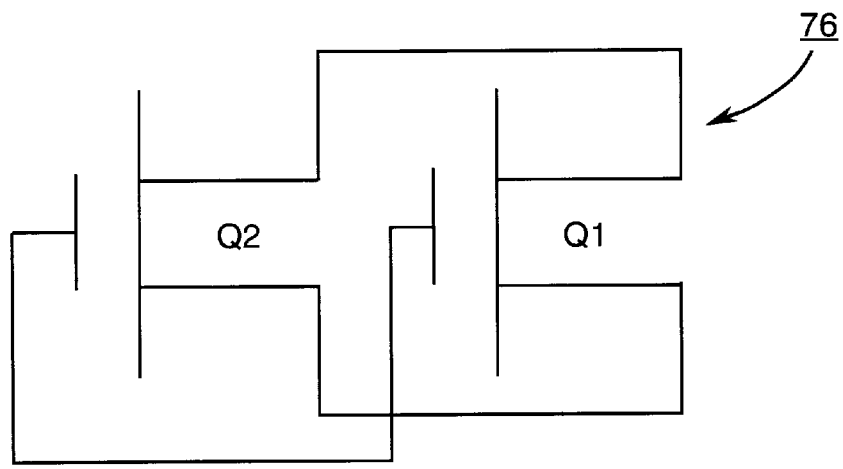

FIG. 8 is composed of FIGS. 8(a), 8(b), 8(c), and 8(d), that respectively illustrate (a) a gate turn-off configuration 74; (b) parallel FETs 76; (c) a current mirror 78; and (d) a gate driver configuration 80. FIG. 8(a) illustrates FETs Q1 and Q2, with Q2 being arranged as a gate turn-off FET which acts as a low resistance path to gate current during turn-off. The low impedance path is important when Q2 is turned on. FIG. 8(b) illustrates the parallel arrangement provided by two FETs Q1 and Q2 arranged as shown therein.

Figure 8C:
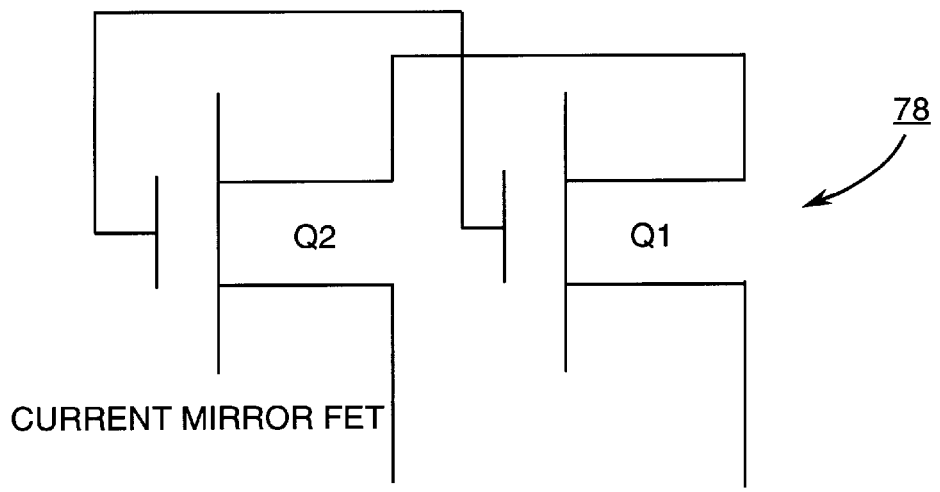

FIG. 8(c) illustrates a current mirror arrangement with the FET Q2 acting as a current mirror FET. The current mirror FET Q2 has an isolated or independent source contact which provides, for example, a representative sample of the total current flowing in the arrangement of FIG. 8(c). This sample can be used as part of a control loop.

Figure 8D:
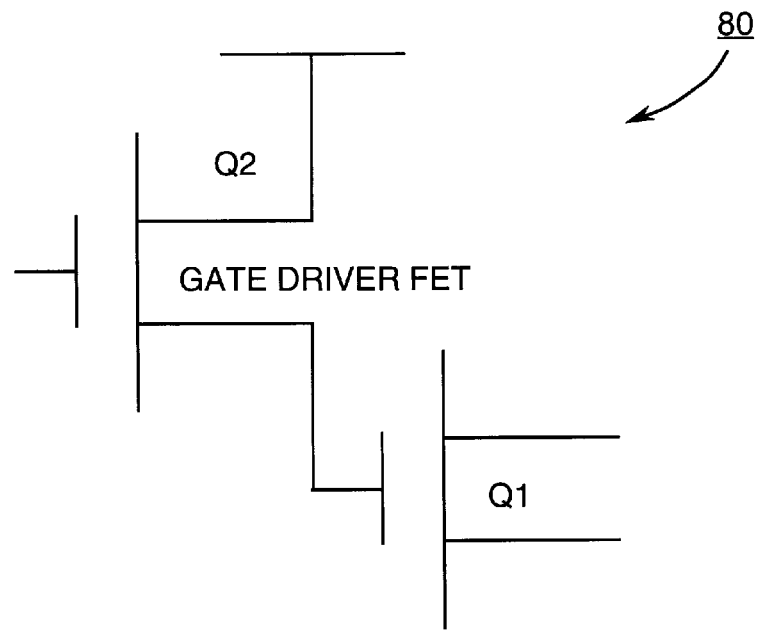

FIG. 8(d) shows a gate driver configuration wherein FET Q2 acts as a gate driver FET that may form part of the FET array 46 of FIG. 5.

In addition to all of the illustrated FET arrangements, the FET arrays of FIGS. 4 and 5 may each be treated as a self-contained device placed on a heat spreading substrate, such as that provided by the copper pad 22. In its simplest form, FET 10 of FIGS. 2 and 3 is a three terminal device (gate, source and drain) wherein all three terminals could be arranged on the same plane using a series of vias to bring all contacts to the same surface in a manner generally illustrated in FIG. 3. This has particular importance if the copper pad 22 has a thickness of about 40 mils, for example.

The present invention advantageously provides for one or more FETs arranged in an array wherein the gate, source and drain terminals of all of the FETs are provided with electrical interconnections by a three layer metallization arrangement. The FET arrays may be selected so as to provide for the desired on-resistance and switching capacitance to serve the needs of a selectable power level.

The present invention also provides several production advantages. First, only one-size FET needs to be produced, and the number of these FETs may be selected to provide a desired operational response for a particular power level. Second, the use of a building block (one-size FET) to provide a larger die increases the yield.

Although certain features of the invention have been illustrated and described herein, many modifications and changes will occur to those skilled in the art. It is, therefore, to be understood that the appended claims were intended to cover all such modifications and changes as fall within the true spirit of the invention.

What is claimed is:

1. A field-effect transistor (FET) package comprising one or more FETs, each FET having gate, source, and drain terminals, each gate terminal having a resistance, the drain and source terminals of each FET having an overlapping capacitance relative to the gate terminal, the FET package comprising:

a first layer of metallization on which each of the one or more FETs is affixed, the first layer being electrically interconnected to the drain terminal of each of the one or more FETs;

a second layer of metallization arranged in parallel with the first layer, the second layer being electrically interconnected to the source terminal of each of the one or more FETs; and a third layer of metallization comprising a gate runner and being electrically interconnected to the gate terminal of each of the one or more FETs, the gate runner arranged in parallel with the first layer and the second layer and having a portion overlapping the first layer and the second layer to minimize the effective resistance of the gate terminals and to minimize the overlapping capacitance between the drain and gate terminals and between the source and gate terminals.

2. The field-effect transistor (FET) package according to claim 1 wherein each of the one or more FETs has a drain terminal on the bottom thereof and wherein the first layer of metallization comprises a bottom layer of metallization in electrical contact with each of the bottom drain terminals.

3. The field-effect transistor (FET) package according to claim 2, further comprising at least one post extending from the bottom layer and an upper metallization layer connected to the at least one post.

4. The field-effect transistor (FET) package according to claim 1, further comprising a resin based polymer composite film interposed between the first, second and third metallization layers.

5. The field-effect transistor (FET) package according to claim 1 wherein each FET has more than one gate terminal and the gate runner is in electrical contact with each of the gate terminals of each FET.

6. The field-effect transistor (FET) package according to claim 1 wherein the first, second and third metallization layers comprise copper.

7. The field-effect transistor (FET) package according to claim 1 wherein the first layer is below the second layer, and the second layer is below the third layer.

8. The field-effect transistor (FET) package according to claim 7, further comprising additional terminals for connection to additional semiconductor devices.

9. The FET package according to claim 1, further comprising a top side and a bottom side, wherein the gate, drain and source terminals are situated on the top side thereof.

10. The FET package according to claim 1 wherein the interconnections between the FETs and the metallization layers comprise HDI interconnections.

11. The FET package according to claim 1 wherein the number of FETs is determined to optimize conduction and switching losses.

12. The FET package according to claim 1 wherein the additional semiconductor devices comprise a gate driver network.

* * * * *